United States Patent
Lee

(10) Patent No.: US 8,431,822 B2
(45) Date of Patent: Apr. 30, 2013

(54) ELECTRICAL SYSTEM HAVING AN ELECTRICAL DISTRIBUTION CENTER

(75) Inventor: John J. Lee, Ann Arbor, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 263 days.

(21) Appl. No.: 12/915,205

(22) Filed: Oct. 29, 2010

(65) Prior Publication Data
US 2012/0056476 A1 Mar. 8, 2012

Related U.S. Application Data

(60) Provisional application No. 61/380,929, filed on Sep. 8, 2010.

(51) Int. Cl.
*H02G 5/00* (2006.01)

(52) U.S. Cl.
USPC ..... 174/68.2; 174/70 B; 174/88 B; 174/99 B; 439/210; 361/624

(58) Field of Classification Search ........... 174/68.2, 174/70 B, 88 B, 99 B, 133 B, 72 B; 439/210; 361/624
See application file for complete search history.

(56) References Cited

U.S. PATENT DOCUMENTS

| | | | | |
|---|---|---|---|---|
| 4,916,574 A | * | 4/1990 | Hancock et al. | 361/649 |
| 6,891,105 B1 | * | 5/2005 | Bach et al. | 174/68.2 |
| 7,759,577 B1 | * | 7/2010 | Morales | 174/68.2 |

* cited by examiner

*Primary Examiner* — Dhirubhai R Patel
(74) *Attorney, Agent, or Firm* — Cantor Colburn LLP

(57) ABSTRACT

An electrical distribution assembly is disclosed. The electrical distribution assembly includes an insulating base member having a primary bus bar channel. The insulating base member includes an isolation plate and sidewalls, to electrically isolate and support a current carrying primary bus bar and position the primary bus bar in the electrical distribution assembly. A plurality of bus bar securing bosses are disposed in the primary bus bar channel and are located between the sidewalls. The bus bar securing bosses are configured to engage a bus bar opening in the primary bus bar. A plurality of sub-bus bar channels, that are smaller in size than the primary bus bar channel are separated by the bus bar securing bosses. The sub-bus bar channels are defined by the isolation plate and sidewalls, and are configured to electrically isolate and support a secondary bus bar.

12 Claims, 4 Drawing Sheets

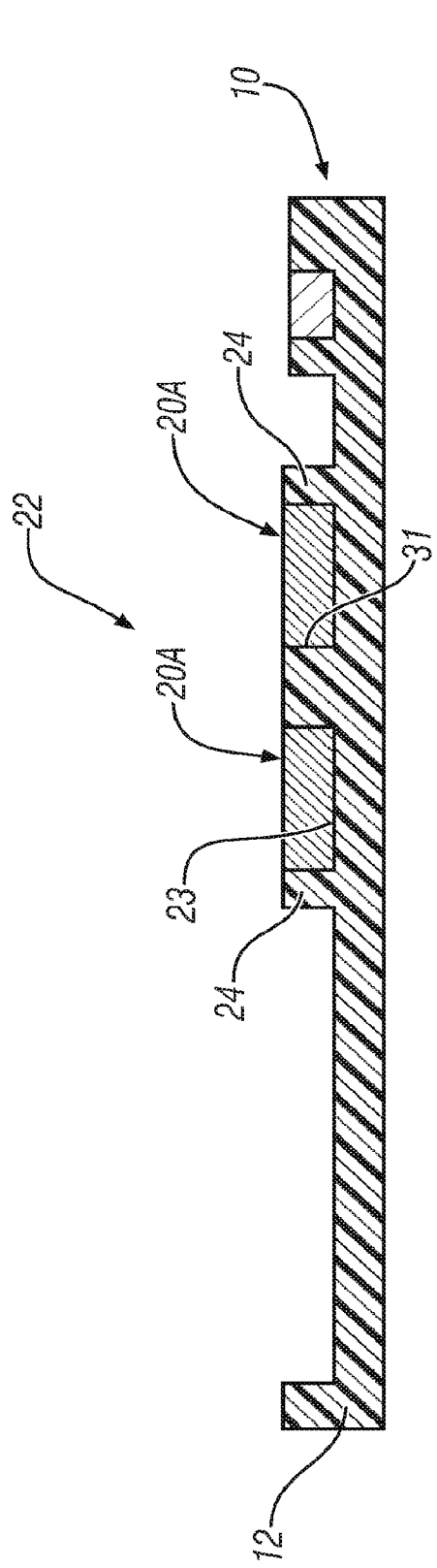
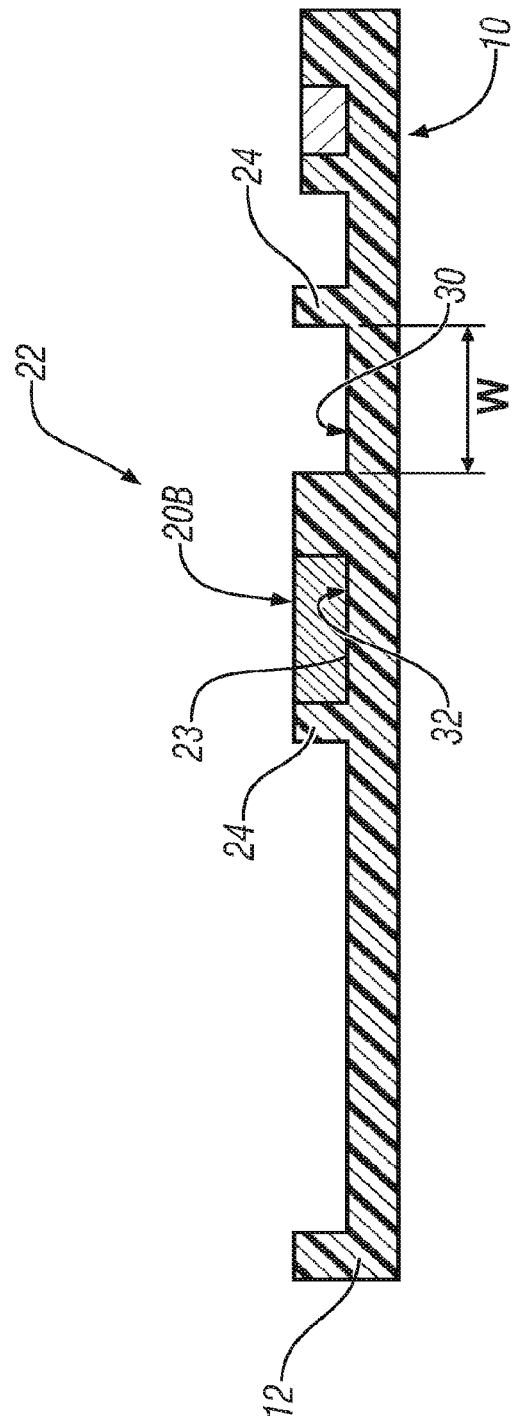
FIG. 4
FIG. 5

ELECTRICAL SYSTEM HAVING AN ELECTRICAL DISTRIBUTION CENTER

CROSS-REFERENCES TO RELATED APPLICATIONS

This patent application claims priority to U.S. Provisional Patent Application Ser. No. 61/380,929 filed Sep. 8, 2010 which is hereby incorporated herein by reference in its entirety.

FIELD OF THE INVENTION

Exemplary embodiments of the present invention relate to electrical distribution assemblies for the management of high voltage electrical supplies and, more particularly, to an electrical distribution assembly having a common structure for different electrical load carrying capacities.

BACKGROUND

Electrical distribution assemblies are commonly used in motor vehicle, aircraft and other transportation applications as well as in stationary applications in which branch connections of a wiring harness, for instance, are supplied with electricity for the operation of various distributed components. In high voltage applications (>60 volts), an electrical distribution assembly is typically structured to contain and support bus bars of various current carrying capacity. The bus bars may extend in a labyrinth manner throughout the electrical distribution assembly in order to connect with, and supply power to, various components and connectors that are in communication with the electrical distribution assembly.

The bus bars typically comprise a metallic, flat plate material such as copper that is stamped in a shape that will suit its application in terms of its electrical load carrying capacity and its ability to fit into the electrical distribution assembly. In motor vehicle applications, for instance, the application of a high voltage electrical distribution assembly incorporating bus bars may be required in hybrid-electric vehicles due to the high power requirement of these vehicles. As one might surmise, a small vehicle may require a lower electrical load carrying capacity than a larger vehicle due to the power required to propel the vehicle during operation. As a result, it is common for such vehicles of varying size to each require custom configured electrical distribution assembly due to the varying magnitude of the electrical loads and, hence varying bus bar sizes to carry and distribute those loads. Such a requirement is expensive and requires a long lead time due to the uniqueness of the electrical distribution assemblies.

SUMMARY OF THE INVENTION

In an exemplary embodiment of the invention an electrical distribution assembly comprises an insulating base member having an isolation plate and sidewalls extending outwardly therefrom to define a primary bus bar channel to electrically isolate and support a current carrying primary bus bar and position the primary bus bar in the electrical distribution assembly. A bus bar securing boss is disposed in the primary bus bar channel to engage a bus bar opening in the primary bus bar. A plurality of sub-bus bar channels, that are smaller in size than the primary bus bar channel, are defined by the bus bar securing boss, the isolation plate and sidewalls, and are configured to electrically isolate and support a secondary bus bar and position the secondary bus bar in the electrical distribution assembly.

In another exemplary embodiment of the invention an electrical system comprises a power source and an electrical distribution assembly for receiving electrical power from the power source. The electrical distribution assembly comprises an insulating base member having an isolation plate and sidewalls extending outwardly therefrom to define a primary bus bar channel to electrically isolate and support a current carrying primary bus bar and position the primary bus bar in the electrical distribution assembly, a bus bar securing boss disposed in the primary bus bar channel to engage a bus bar opening in the primary bus bar and a plurality of sub-bus bar channels, that are smaller in size than the primary bus bar channel, defined by the bus bar securing boss, the isolation plate and sidewalls, and configured to electrically isolate and support a secondary bus bar and position the secondary bus bar in the electrical distribution assembly.

In yet another embodiment of the invention a motor vehicle electrical system comprises a power source and an electrical distribution assembly for receiving electrical power from the power source. The electrical distribution assembly comprises an insulating base member having an isolation plate and sidewalls extending outwardly therefrom to define a primary bus bar channel to electrically isolate and support a current carrying primary bus bar and position the primary bus bar in the electrical distribution assembly, a bus bar securing boss disposed in the primary bus bar channel to engage a bus bar opening in the primary bus bar and a plurality of sub-bus bar channels, that are smaller in size than the primary bus bar channel, defined by the bus bar securing boss, the isolation plate and sidewalls, and configured to electrically isolate and support a secondary bus bar and position the secondary bus bar in the electrical distribution assembly.

The above features and advantages and other features and advantages of the invention are readily apparent from the following detailed description of the invention when taken in connection with the accompanying drawings.

BRIEF DESCRIPTION OF THE DRAWINGS

Other objects, features, advantages and details appear, by way of example only, in the following detailed description of the embodiments, the detailed description referring to the drawings in which:

FIG. 4 is a sectional view of the electrical distribution assembly of FIG. 2 taken along line 4-4; and FIG. 5 is a sectional view of the electrical distribution assembly of FIG. 3 taken along line 5-5.

DESCRIPTION OF THE EMBODIMENTS

Figure 1:
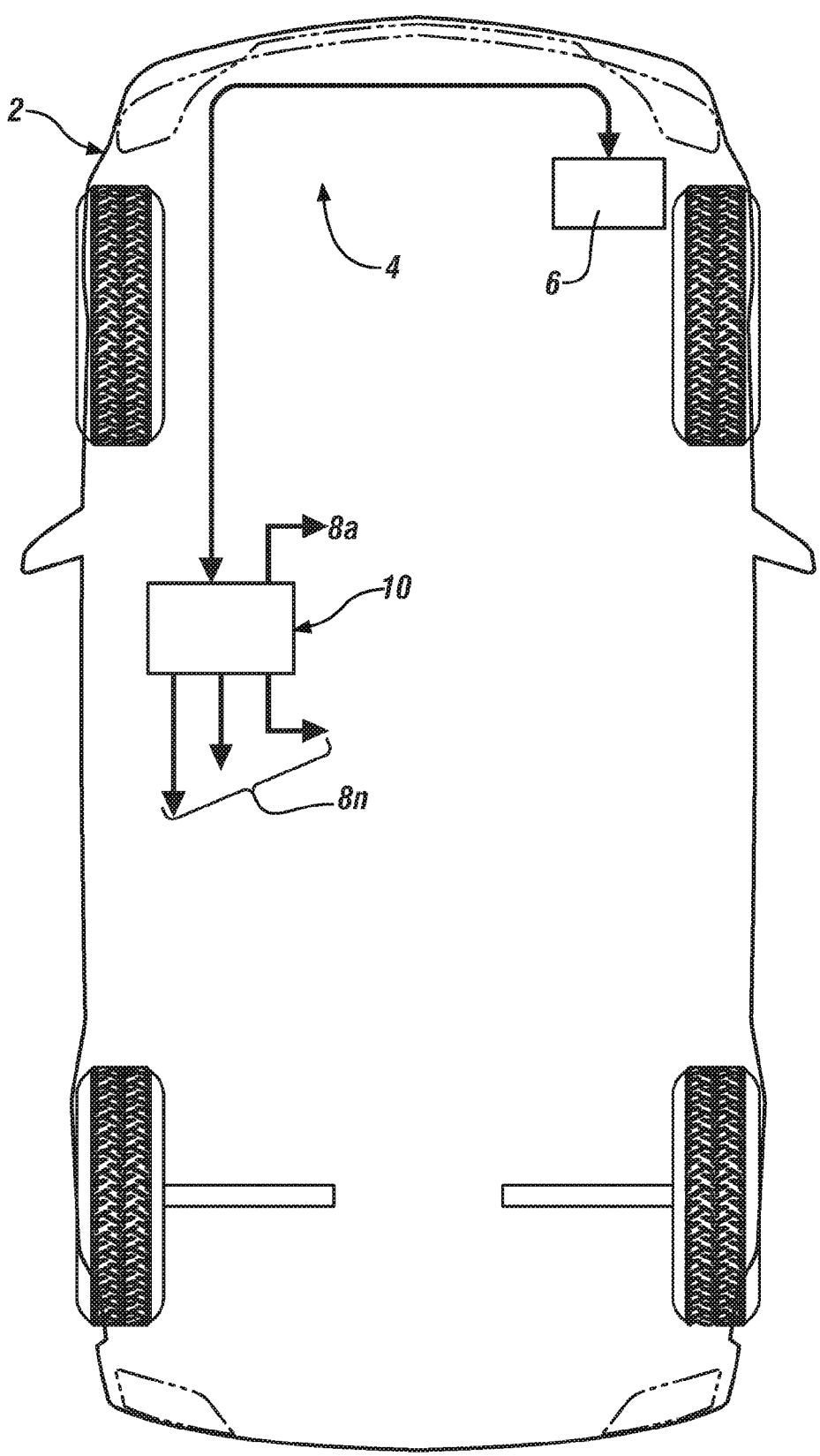
FIG. 1 is a schematic view of a motor vehicle electrical system embodying features of the invention.

The following description is merely exemplary in nature and is not intended to limit the present disclosure, its application or uses. It should be understood that throughout the drawings, corresponding reference numerals indicate like or corresponding parts and features.

Figure 2:
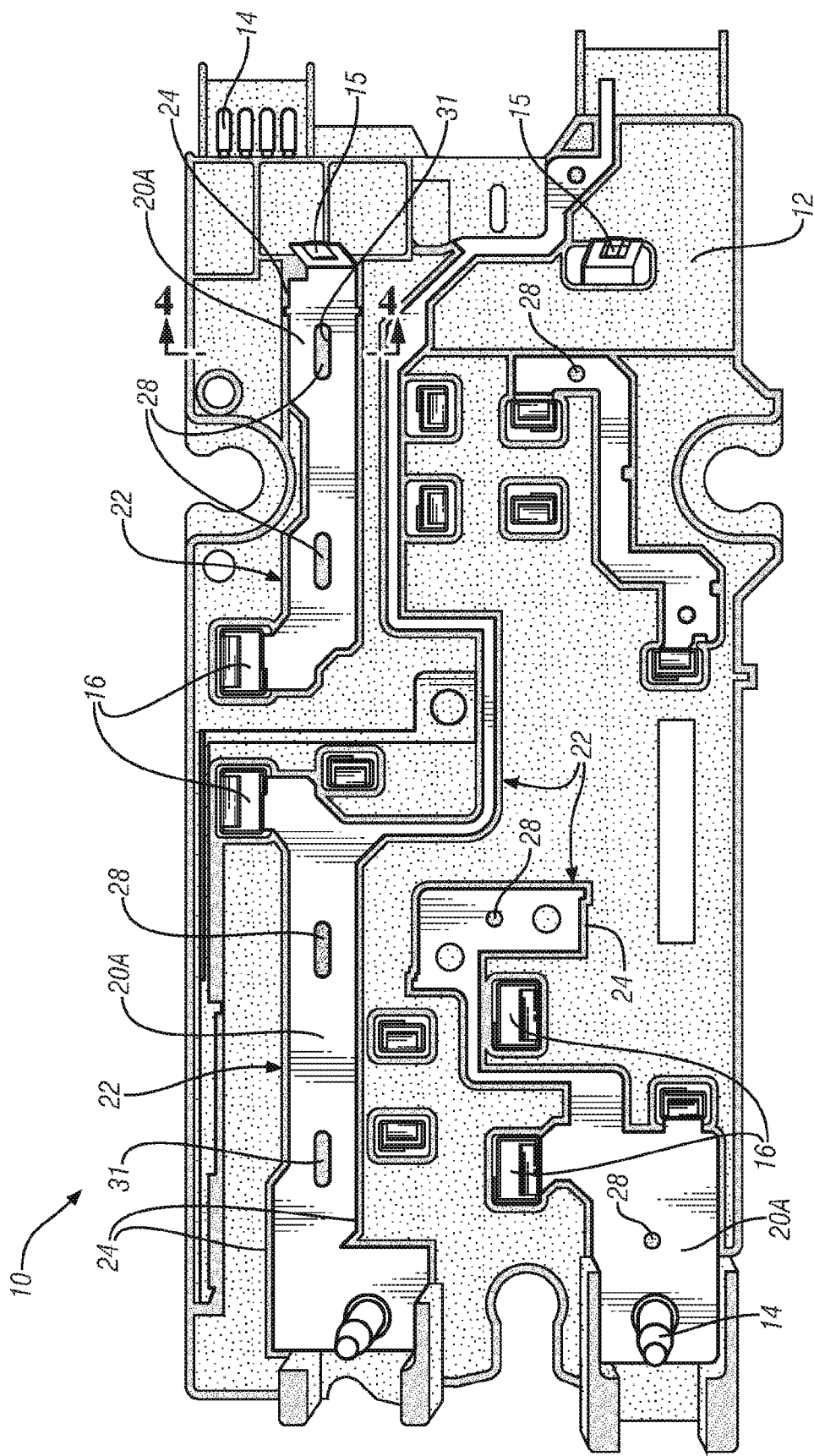
FIG. 2 is a plan view of the interior of an electrical distribution assembly embodying features of the invention.
Figure 3:
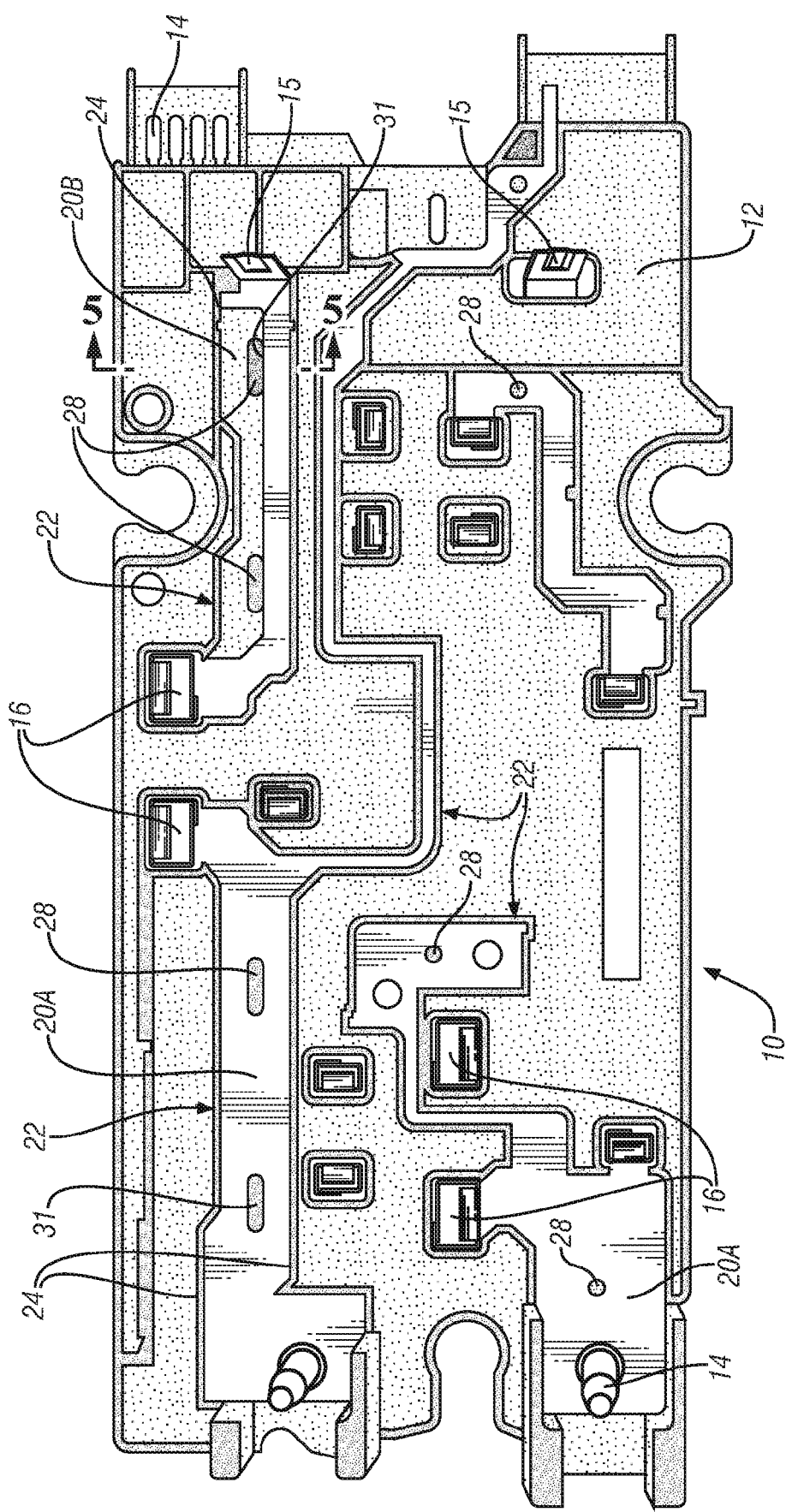
FIG. 3 is a plan view of the interior of an another embodiment of the electrical distribution assembly of FIG. 2.

Referring to FIG. 1 a motor vehicle 2 includes an electrical system, designated generally as 4, for the distribution of electrical power to various components (not shown) of the vehicle. The electrical system includes a power source that may comprise one or more batteries 6 that receive an electrical charge from an engine driven motor/generator (not shown) or other suitable source of electricity. The battery 6 supplies electrical power, for distribution 8A-8n to the various vehicle components, to an electrical distribution assembly 10 that receives power therefrom. The electrical distribution assembly 10 includes an insulating base member 12 that is configured to support any number of connectors 14 plug receptacles 16 and primary bus bars 20A. The primary bus bars 20A are utilized to transfer relatively high levels of current and are typically sized (width and thickness) based on their expected current carrying requirements. The primary bus bars 20A carry current to and from connectors 14, 15, through plug receptacles 16 and other equipment and accessories that may be associated with the electrical distribution assembly 10. The base member 12 operates as an electrical isolator for the primary bus bars 20A. Referring to FIGS. 2 and 3, the base member 12 includes an isolation plate 23 and sidewalls 24 extending outwardly therefrom that define the primary bus bar channels 22. The primary bus bar channels 22 function to electrically isolate the primary bus bars 20A from other components of the base member 12 and precisely position each of the primary bus bars 20A therein.

As is illustrated in FIG. 1, the insulating base member 12 can be an intricate, highly detailed component that includes numerous primary bus bar channels 22 of varying dimension, mounting sites for connectors 14 and receptacles 16 as well as other items of varying shape and size that are required for the electrical distribution assembly to carry out its function. Simply put, the insulating base member 12 is a complex, long lead time, expensive part that can benefit from high volume use across many applications rather than low volume use with a unique configuration for each application. One common reason for the inability to use an insulating base member 12 in more than one application is due to differing power requirements across applications that necessitate different sized bus bars 20A.

Referring again to FIGS. 1 and 3, in an exemplary embodiment of a first mode of construction and operation of the electrical distribution assembly, a series of bus bar securing bosses 28 are located in the primary bus bar channels 22 and engage openings 31 in the primary bus bars 20A. The bus bar securing bosses 28 along with the isolation plates 23 and sidewalls 24 are effective to securely position and isolate the primary bus bars 20A in the primary bus bar channels 22 of the electrical distribution assembly 10. As shown in the Figures, in an exemplary embodiment, the bus bar securing bosses 28 may be configured to extend axially in the primary bus bar channels 22; however the actual configuration of the bosses may vary. Round, rectangular and other suitable configurations are contemplated, FIG. 2.

Referring now to FIGS. 2 and 4, a second mode of construction and operation of the electrical distribution assembly 10 is illustrated. In the case of a lower power application of the electrical distribution assembly 10, the bus bar securing bosses 28, in concert with the isolation plates 23 and the sidewalls 24, function to define a plurality of sub-bus bar channels such as first and second sub-bus bar channels 30 and 32, respectively, that are smaller in size (width "W") than the primary bus bar channels 22. As a result of the plurality of sub-bus bar channels 30 and 32 a smaller, secondary bus bar 20B having a different or lower current carrying capacity may easily be substituted for the primary bus bar 20A without the requirement that the insulating base member 12, the primary bus bar channels 22 or the isolation plates or side walls 24 be modified. The capability to "switch out" primary and secondary bus bars 20A, 20B of varying current carrying capacity, without the need to modify the insulating base member 12 of the electrical distribution assembly 10 results in significant savings in time and cost by allowing the re-use of similar or the same parts.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed but that the invention will include all embodiments falling within the scope of the application.

What is claimed is:

1. An electrical distribution assembly comprising:
   an insulating base member having an isolation plate and sidewalls extending outwardly therefrom to define a primary bus bar channel to electrically isolate and support a current carrying primary bus bar and position the primary bus bar in the insulating base member;
   a plurality of bus bar securing bosses disposed in the primary bus bar channel and located between the sidewalls, the bus bar securing bosses configured to engage a plurality of bus bar openings in the primary bus bar; and
   a plurality of sub-bus bar channels that are positioned within and are smaller in size than the primary bus bar channel, the sub-bus bar channels separated by the bus bar securing bosses, the sub-bus bar channels defined by the isolation plate, the sidewalls, and in part by the primary bus bar channel, the sub-bus bar channels configured to electrically isolate and support a secondary bus bar and position the secondary bus bar in the insulating base member.

2. The electrical distribution assembly of claim 1, wherein the plurality of bus bar securing bosses are axially extending in the primary bus bar channel.

3. The electrical distribution assembly of claim 1, wherein the primary bus bar has a different electrical load carrying capacity than the secondary bus bar.

4. The electrical distribution assembly of claim 3, wherein the load carrying capacity of the secondary bus bar is less than the load carrying capacity of the primary bus bar.

5. An electrical system comprising:
   a power source;
   an electrical distribution assembly for receiving electrical power from the power source, the electrical distribution assembly comprising:
   an insulating base member having an isolation plate and sidewalls extending outwardly therefrom to define a primary bus bar channel to electrically isolate and support a current carrying primary bus bar and position the primary bus bar in the insulating base member;
   a plurality of bus bar securing bosses disposed in the primary bus bar channel and located between the sidewalls, the bus bar securing bosses configured to engage a plurality of bus bar openings in the primary bus bar; and
   a plurality of sub-bus bar channels that are positioned within and are smaller in size than the primary bus bar channel, the sub-bus bar channels separated by the bus bar securing bosses, the sub-bus bar channels defined by the isolation plate, the sidewalls, and in part by the primary bus bar channel, the sub-bus bar channels configured to electrically isolate and support a secondary bus bar and position the secondary bus bar in the insulating base member.

6. The electrical system of claim 5, wherein the plurality of bus bar securing bosses are axially extending in the primary bus bar channel.

7. The electrical system of claim 5, wherein the primary bus bar has a different electrical load carrying capacity than the secondary bus bar.

8. The electrical system of claim 5, wherein the power source comprises a battery or a motor/generator, or both.

9. A motor vehicle electrical system comprising:
a motor vehicle power source;
a motor vehicle electrical distribution assembly for receiving electrical power from the motor vehicle power source, the motor vehicle electrical distribution assembly comprising:
an insulating base member having an isolation plate and sidewalls extending outwardly therefrom to define a primary bus bar channel to electrically isolate and support a current carrying primary bus bar and position the primary bus bar in the insulating base member;
a plurality of bus bar securing bosses disposed in the primary bus bar channel and located between the sidewalls, the bus bar securing bosses configured to engage plurality of bus bar openings in the primary bus bar; and
a plurality of sub-bus bar channels that are positioned within and are smaller in size than the primary bus bar channel, the sub-bus bar channels separated by the bus bar securing bosses, the sub-bus bar channels defined by the isolation plate, the sidewalls, and in part by the primary bus bar channel, the sub-bus bar channels configured to electrically isolate and support a secondary bus bar and position the secondary bus bar in the insulating base member.

10. The motor vehicle electrical system of claim 9, wherein the plurality of bus bar securing bosses are axially extending in the primary bus bar channel.

11. The motor vehicle electrical system of claim 9, wherein the primary bus bar has a different electrical load carrying capacity than the secondary bus bar.

12. The motor vehicle electrical system of claim 9, wherein the motor vehicle power source comprises a battery or a motor/generator, or both.

* * * * *